United States Patent
Suzuki et al.

(10) Patent No.: US 7,262,650 B2
(45) Date of Patent: Aug. 28, 2007

(54) AMPLITUDE ADJUSTING CIRCUIT

(75) Inventors: Hirohisa Suzuki, Gunma (JP); Kazuo Hasegawa, Gunma (JP); Eiji Akama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/333,547

(22) Filed: Jan. 18, 2006

(65) Prior Publication Data
US 2006/0176084 A1    Aug. 10, 2006

(30) Foreign Application Priority Data
Jan. 19, 2005    (JP)    ............................. 2005-011398

(51) Int. Cl.
*H03L 5/00* (2006.01)
(52) U.S. Cl. ...................... 327/306; 327/327; 327/328; 327/538; 327/542; 330/288; 323/315
(58) Field of Classification Search ...................... None
See application file for complete search history.

(56) References Cited

U.S. PATENT DOCUMENTS

| | | | |
|---|---|---|---|
| 4,791,326 A * | 12/1988 | Vajdic et al. | ............... 327/391 |
| 4,995,111 A * | 2/1991 | Tojo et al. | .................. 379/382 |
| 6,483,381 B1 * | 11/2002 | Shau | ........................... 329/317 |
| 2005/0002316 A1 * | 1/2005 | Maruyama | .................. 369/116 |

FOREIGN PATENT DOCUMENTS

JP    2001-119442    4/2001

* cited by examiner

*Primary Examiner*—Tuan T. Lam
*Assistant Examiner*—William Hernandez
(74) *Attorney, Agent, or Firm*—Fish & Richardson P.C.

(57) ABSTRACT

An amplitude adjusting circuit comprises a first current mirror where a variable current of a variable current source is copied into each of 1st-3rd transistors; a second current mirror where the variable current is copied into each of 11th-13th transistors; a third current mirror having 6th-7th transistors where a current through the 2nd transistor copied from the variable current flows through the 6th transistor; a fourth current mirror having 8th-9th transistors where a current through the 12th transistor copied from the variable current flows through the 8th transistor; an inverter that has 1st-2nd conductivity type transistors and produces an output signal corresponding to a current level of the 7th or 9th transistor; a fifth current mirror having 15th-14th transistors where a current through the 14th transistor copied from the 15th transistor's becomes a current sourced by the 7th transistor; and a sixth current mirror having 5th-4th transistors where a current through the 4th transistor copied from the 5th transistor's becomes a current sunk by the 9th transistor.

11 Claims, 9 Drawing Sheets

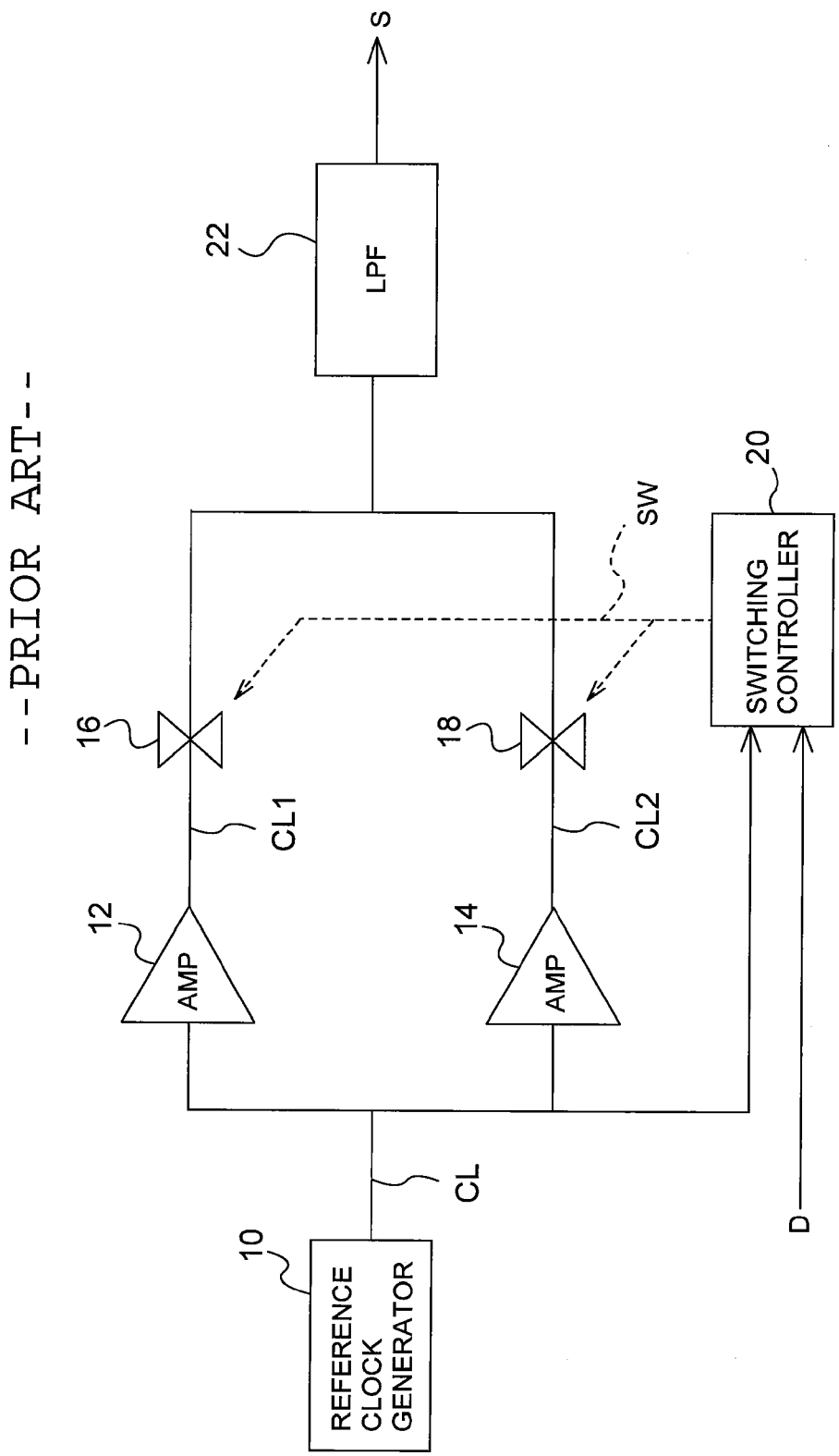
FIG.8 --PRIOR ART--

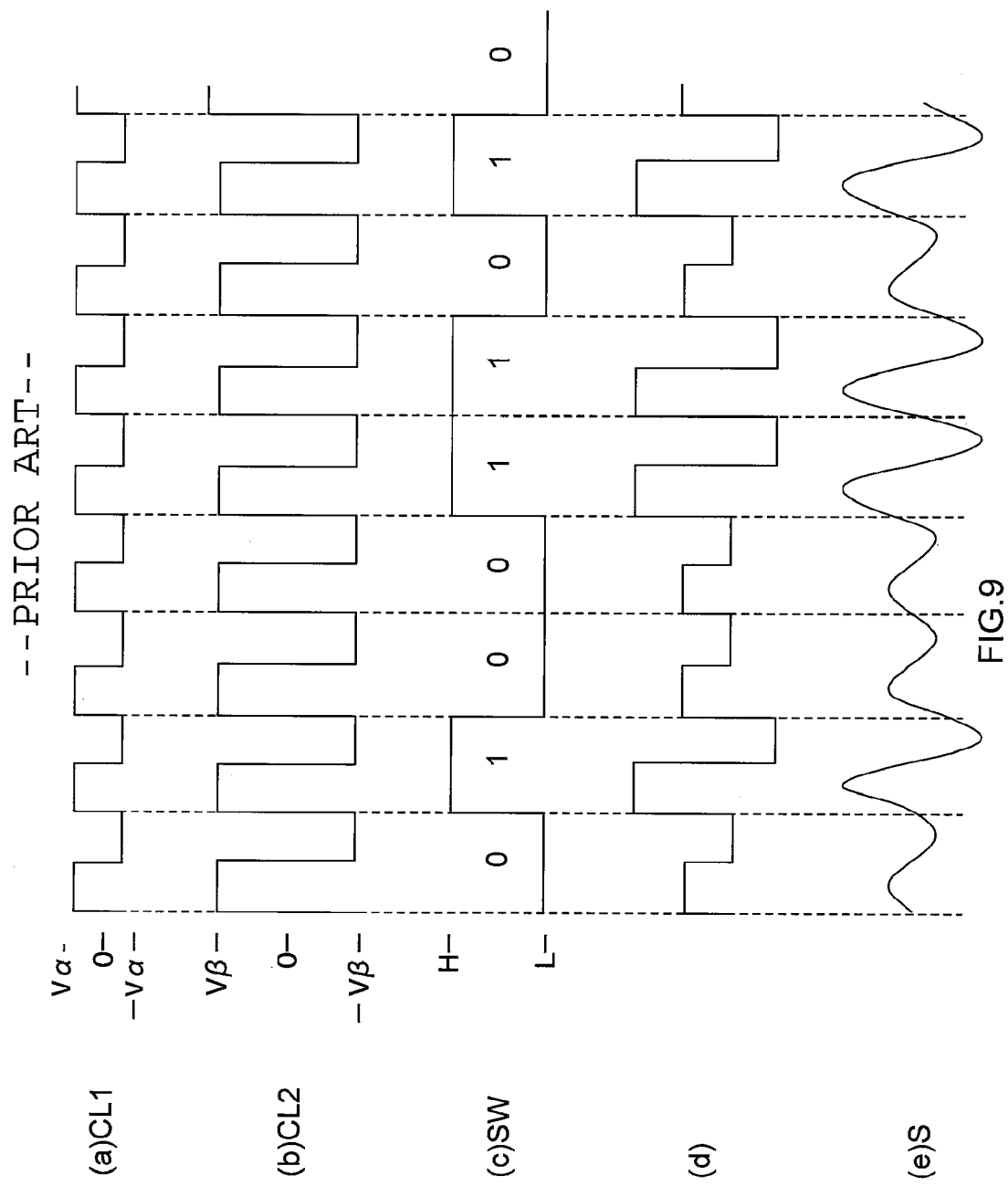
FIG.9 --PRIOR ART--

… (US 7,262,650 B2)

AMPLITUDE ADJUSTING CIRCUIT

CROSS-REFERENCE TO RELATED APPLICATIONS

The present application claims priority from Japanese Patent Application No. 2005-11398 filed on Jan. 19, 2005, which is herein incorporated by reference.

BACKGROUND OF THE INVENTION

1. Field of the Invention

The present invention relates to an amplitude adjusting circuit.

2. Description of the Related Art

Through communication networks such as LANs in offices and vehicle-mounted networks, digital signals are transmitted between apparatuses in the form of signals of various formats. Communication networks are beginning to be used to connect various digital apparatuses other than computers as well as being used to connect computers and their peripherals. An example thereof is vehicle-mounted networks and, for example, a MOST (Media Oriented Systems Transport) system has been proposed as a standard for vehicle-mounted networks. In the MOST system, a ring-like vehicle-mounted network is configured, and various apparatuses such as a car navigation system, a CD/DVD player, a speaker, a display, a telephone are connected to the network. The vehicle-mounted network is used, for example, in a way that the CD/DVD player transmits a reproduced digital signal to the speaker via the vehicle-mounted network and that the speaker converts the digital signal into voice and outputs.

As a digital signal transmission method in a communication network, there are a base band method in which a digital signal is transmitted as it is and a broad band method in which an analog signal obtained by modulating a carrier wave with a digital signal is transmitted. An amplitude shift keying method as a broad band method will be described in detail below.

FIG. 8 is a diagram illustrating the configuration of a conventional ASK modulation circuit. The ASK modulation circuit of. FIG. 8 has transmit data D, that is serial digital data, inputted thereto and generates an ASK modulated signal S whose amplitude varies in response to changes in the bit value of the transmit data D over time and outputs to a network.

With reference to the waveforms of main signals of the conventional ASK modulation circuit of FIG. 9 as needed, the configuration of the ASK modulation circuit of FIG. 8 will be described.

A reference clock generator 10 generates a clock signal CL of a frequency proportional to the bit rate of the transmit data D. Let r be the bit rate (bps) of the transmit data D, then the frequency of the clock signal CL is expressed as n (natural number)×r (Hz).

Amplifiers 12, 14 each have the clock signal CL of a rectangular waveform inputted thereto and have their output amplitude level decided by a predetermined gain. For example, the amplifiers 12, 14 produce respective clock signals CL1, CL2 of a rectangular waveform that swing to their peak and bottom with ground potential (zero level) as their reference (see (a), (b) of FIG. 9). Note that the clock signals CL1, CL2 are set to have amplitude levels different from each other.

A switching controller 20 latches the bit value of the transmit data D synchronously with the clock signal CL and depending on the bit value, generates a control signal SW to control the on/off of switches 16, 18 (see (c) of FIG. 9).

The switches 16, 18 switch on/off complimentarily according to the control signal SW supplied from the switching controller 20. For example, when the control signal SW is at a High (H) level, the switch 16 is off and the switch 18 is on. When the control signal SW is at a Low (L) level, the switch 16 is on and the switch 18 is off. The outputs of the switches 16, 18 are combined and input to an LPF 22.

The LPF 22 removes the high frequency component from the combined signal of the outputs of the switches 16, 18 (see (d) of FIG. 9) and produces the ASK modulated signal S of a smooth sine waveform (see (e) of FIG. 9).

Such a conventional ASK modulation circuit is disclosed in, for example, Japanese Patent Laid-Open Publication No. 2001-119442).

With circuits like the amplifiers 12, 14 of FIG. 8 that set their output amplitude level (hereinafter called conventional "amplitude setting circuits"), there is the problem that their gain varies with temperature because circuit elements thereof have a temperature characteristic. As a result, although its amplitude level is set, the output signal varies in amplitude with temperature. Furthermore, to change the amplitude level of the output signal, the amplifier needs to be replaced by an amplifier having a gain corresponding to the new amplitude level.

Hence, instead of a fixed-gain amplifier like the amplitude setting circuit, a circuit whose output amplitude level is adjustable arbitrarily through the choice of resistances such as a resistor-ladder electronic volume or an attenuator (hereinafter called a conventional "amplitude adjusting circuit") is often adapted. However, it is known that the conventional amplitude adjusting circuit is easy to be affected by temperature variation like the conventional amplitude setting circuit is, thus having large variation in its output amplitude level. Moreover, since the conventional amplitude adjusting circuit has its output amplitude level adjusted through the choice of a finite number of resistances, there is a great restriction on fine adjustment of the amplitude level, and also there is the problem that it is difficult to arbitrarily select the operation reference voltage of a circuit at the rear stage. Further, the conventional amplitude adjusting circuit is complex in configuration, thus causing the problem that the scale of the entire system becomes large.

SUMMARY OF THE INVENTION

According to a main aspect of the present invention to solve the above and other problems, there is provided an amplitude adjusting circuit which adjusts an amplitude level of its output signal in response to an input signal. The adjusting circuit comprises a variable current source (I1) that Igenerates a variable current; an inverter that has a first conductivity type transistor (M1) and a second conductivity type transistor (M2) which are opposite in conductivity type to each other and connected in series in between a source power line and a sink power line, and produces the output signal whose logic level is the inverse of that of the input signal; a first source-side current mirror, section provided on the source power line side, where of two first source-side transistors whose control electrodes are connected in common, one first source-side transistor (Q6) is connected to form a diode, the other first source-side transistor (Q7) is provided between the source power line and the first conductivity type transistor (M1), and a current corresponding to the variable current flows through the one first source-side transistor (Q6); a first sink-side current mirror section provided on the sink power line side, where of two first sink-side transistors whose control electrodes are connected in common, one first sink-side transistor (Q8) s connected to form a diode, the other first sink-side transistor (Q9) is provided between the second conductivity type transistor (M2) and the sink power line, and a current corresponding to the variable current flows through the one first sink-side transistor (Q8); a second sink-side current mirror section provided on the sink power line side, where of two second sink-side transistors whose control electrodes are connected in common, one second sink-side transistor (Q15) is connected to form a diode, the other second sink-side transistor (Q14) is provided between the sink power line and a connection point of the other first source-side transistor (Q7) and the first conductivity type transistor (M1), and currents corresponding to the variable current flow through the one and other second sink-side transistors (Q15, Q14), the current through the transistor (Q14) flowing through the other first source-side transistor (Q7); and a second source-side current mirror section provided on the source power line side, where of two second source-side transistors whose control electrodes are connected in common, one second source-side transistor (Q5) is connected to form a diode, the other second source-side transistor (Q4) is provided between the source power line and a connection point of the second conductivity type transistor (M2) and the other first sink-side transistor (Q9), and currents corresponding to the variable current flow through the one and other second source-side transistor (Q5, Q4), the current through the transistor (Q4) flowing through the other first sink-side transistor (Q9). With the amplitude level of the output signal being adjusted according to the variable current, the respective currents flowing through the one and other first source-side transistors (Q6, Q7) are set equal, and the respective currents flowing through the one and other first sink-side transistors (Q8, Q9) are set equal.

According to the invention, there is provided an amplitude adjusting circuit which can adjust the amplitude level by using a simple mechanism and stabilize the adjusted amplitude level against temperature variation.

Features and objects of the present invention other than the above will become apparent from the description of this specification and the accompanying drawings.

BRIEF DESCRIPTION OF THE DRAWINGS

For a more complete understanding of the present invention and the advantages thereof, reference is now made to the following description taken in conjunction with the accompanying drawings wherein:

FIG. 8 is a diagram showing the configuration of a conventional ASK modulation circuit; and FIG. 9 is a diagram showing the waveforms of main signals of the conventional ASK modulation circuit.

DETAILED DESCRIPTION OF THE INVENTION

At least the following matters will be made clear by the explanation in the present specification and the description of the accompanying drawings.

<First Implementation>

==Configuration and Operation of First Amplitude Adjusting Circuit==

Figure 1:
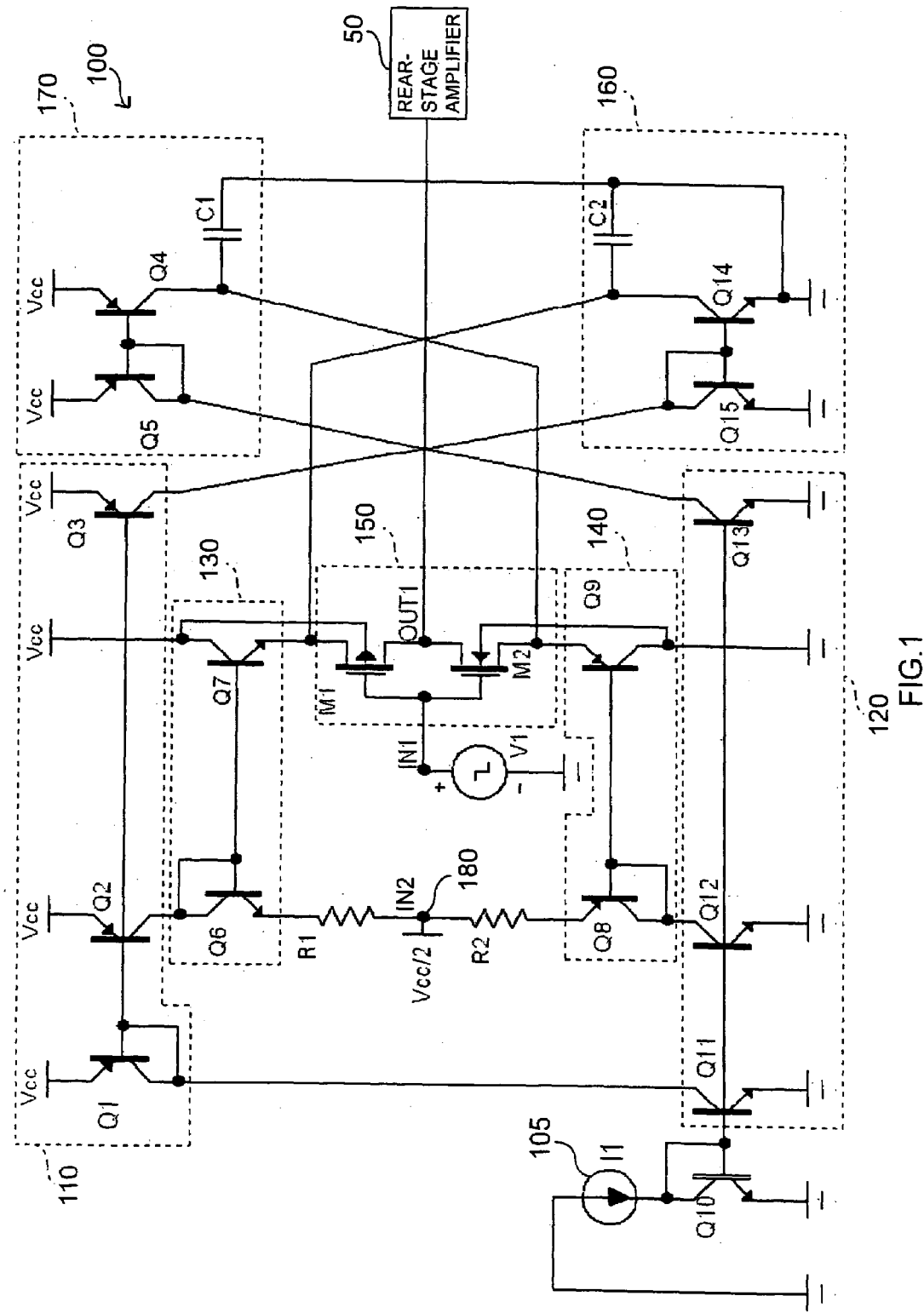
FIG. 1 is a diagram showing the configuration of a first amplitude adjusting circuit according to a first implementation of the present invention.

FIG. 1 is a diagram illustrating the configuration of a first amplitude adjusting circuit 100 according to a first implementation of the present invention. The first amplitude adjusting circuit 100 adjusts the amplitude level of its output signal VOUT1 which is the inverse of an input signal VIN1 of a rectangular waveform. The first amplitude adjusting circuit 100 is used as, for example, a circuit adjusting the amplitude level of a clock signal in the ASK modulation circuit like the amplifier 12, 14 of FIG. 8.

A first current mirror section 110 has first, second, and third transistors Q1, Q2, Q3 provided on the source power line of potential Vcc side, of which the control electrodes (e.g., base electrodes described later) are connected to each other, where the first transistor Q1 is connected to form a diode. With this configuration, a variable current I1 of a variable current source 105 flowing through a tenth transistor Q10 connected to form a diode is copied into the first to third transistors (Q1, Q2, Q3).

In the present implementation, PNP, bipolar transistors are used as the first to third transistors (Q1, Q2, Q3). The emitter electrodes of the first to third transistors (Q1, Q2, Q3) are connected to the source power line and the base electrodes thereof are connected in common. The base and collector electrodes of the first transistor Q1 are short-circuited to form a diode. The first transistor Q1 and an 11th transistor Q11 are connected in series between the source power line and a sink power line. With this configuration, the variable current I1 is copied as the emitter currents of the first to third transistors (Q1, Q2, Q3).

A second current mirror section 120 has 11th, 12th, and 13th transistors Q11, Q12, Q13 provided on the sink power line of potential Gnd side, of which the control electrodes (e.g., base electrodes described later) are connected to each other, where the 11th transistor Q11 is connected to form a diode. With this configuration, the variable current I1 of the variable current source 105 flowing through the tenth transistor Q10 connected to form a diode is copied into the 11th to 13th transistors (Q11, Q12, Q13).

In the present implementation, NPN bipolar transistors are used as the 11th to 13th transistors (Q11, Q12, Q13). The emitter electrodes of the 11th to 13th transistors (Q11, Q12, Q13) are connected to the sink power line and the base electrodes thereof are connected in common. The base and collector electrodes of the 11th transistor Q11 are short-circuited to form a diode. With this configuration, the variable current I1 is copied as the emitter currents of the 11th to 13th transistors (Q11, Q12, Q13).

In the present implementation, an NPN bipolar transistor is used as the tenth transistor Q10. As to the tenth transistor Q10, the variable current I1 of the variable current source 105 is supplied into its collector; its emitter electrode is connected to the sink power line, and its base and collector electrodes are short-circuited to form a diode. Further, the base electrode of the tenth transistor Q10 is connected in common with the base electrodes of the 11th to 13th transistors (Q11, Q12, Q13) of the second current mirror section 120. With this configuration, the variable current T1 of the variable current source 105 flowing through the tenth transistor Q10 is copied as the collector currents of the first to third transistors (Q1, Q2, Q3) and also as the emitter currents of the 11th to 13th transistors (Q11, Q12, Q13). In the case where a PNP bipolar transistor is used as the tenth transistor Q10, the variable current source 105 and the tenth transistor Q10 are connected to the first current mirror section 110 side.

A third current mirror section 130 is an implementation of a "first source side current mirror section" according to the invention. The third current mirror section 130 comprises a sixth transistor Q6 (one first source side transistor) connected in series to the sink power line side of the second transistor Q2 and connected to form a diode, and a seventh transistor Q7 (the other first source side transistor) whose control electrode (e.g., a base electrode described later) is connected to the control electrode (e.g., a base electrode) of the sixth transistor Q6. With this configuration, the collector current of the second transistor Q2, copied from the variable current I1, flows through the sixth transistor Q6.

In the present implementation, NPN bipolar transistors are used as the sixth and seventh transistors (Q6, Q7) and the base electrodes of the sixth and seventh transistors (Q6, Q7) are connected in common. As to the sixth transistor Q6, its collector electrode is connected to the collector electrode of the second transistor Q2; its emitter electrode is connected to a reference voltage applying point 180 via a first resistor R1, and its base and collector electrodes are short-circuited to form a diode. As to the seventh transistor Q7, its collector electrode is connected to the source power line, and its emitter electrode is connected to the source power line side electrode (e.g., a source electrode described later) of a first conductivity type transistor M1 of an inverter 150.

A fourth current mirror section 140 is an implementation of a "first sink side current mirror section" according to the invention. The fourth current mirror section 140 comprises an eighth transistor Q8 (one first sink side transistor) connected in series to the source power line side of the 12th transistor Q12 and connected to form a diode, and a ninth transistor Q9 (the other first sink side transistor) whose control electrode (e.g., a base electrode described later) is connected to the control electrode (e.g., a base electrode) of the eighth transistor Q8. With this configuration, the emitter current of the 12th transistor Q12, copied from the variable current I1, flows through the eighth transistor Q8.

In the present implementation, PNP bipolar transistors are used as the eighth and ninth transistors (Q8, Q9) and the base electrodes of the eighth and ninth transistors (Q8, Q9) are connected in common. As to the eighth transistor Q8, its collector electrode is connected to the collector electrode of the 12th transistor Q12; its emitter electrode is connected to a reference voltage applying point 180 via a second resistor R2, and its base and collector electrodes are short-circuited to form a diode. As to the ninth transistor Q9, its collector electrode is connected to the sink power line, and its emitter electrode is connected to the sink power line side electrode (e.g., a source electrode described later) of a second conductivity type transistor M2 of the inverter 150.

The inverter 150 comprises the first conductivity type transistor M1 connected in series to the sink power line side of the seventh transistor Q7 and the second conductivity type transistor M2 connected in series to the source power line side of the ninth transistor Q9, which transistors M1, M2 are connected in series. The first and second conductivity type transistors are opposite in conductivity type to each other such as P MOS and N MOS transistors.

In the inverter 150, the emitter current of the seventh transistor Q7 flows through the first conductivity type transistor M1, and the emitter current of the ninth transistor Q9 flows through the second conductivity type transistor M2. Furthermore, the inverter 150 produces an output signal VOUT1 that has either one logic level (H level) corresponding to the emitter current of the seventh transistor Q7 when the first conductivity type transistor M1 is rendered conductive or the other logic level (L level) corresponding to the emitter current of the ninth transistor Q9 when the second conductivity type transistor M2 is rendered conductive according to the logic level of the input signal VIN1 of a rectangular voltage V1 waveform. This output signal VOUT1 is input to a rear-stage amplifier 50, which is connected directly to the inverter 150. The rear-stage amplifier 50 is a circuit that performs a predetermined amplifying operation with a current flowing through it in response to the input signal edges.

In the implementation, voltage-driven MOS transistors are used as the first conductivity type transistor M1 and the second conductivity type transistor M2, of which the gate electrodes and the drain electrodes are respectively connected to each other. The source electrode of the first conductivity type transistor M1 is connected to the emitter electrode of the transistor Q7, and the source electrode of the second conductivity type transistor M2 is connected to the emitter electrode of the transistor Q9.

A fifth current mirror section 160 is an implementation of a "second sink side current mirror section" according to the invention. The fifth current mirror section 160 comprises a 15th transistor Q15 (one second sink side transistor) connected in series to the sink power line side of the 3rd transistor Q3 and connected to form a diode, and a 14th transistor Q14 (the other second sink side transistor) whose control electrode (e.g., a base electrode described later) is connected to the control electrode (e.g., a base electrode) of the 15th transistor Q15. The source power line side of the 14th transistor Q14 is connected in common with the connection point of the 7th transistor Q7 and the first conductivity type transistor M1. With this configuration, the collector current of the 3rd transistor Q3, copied from the variable current I1, flows through the 15th transistor Q15; the current through the 15th transistor Q15 is copied into the 14th transistor Q14, and the current through the 14th transistor Q14 becomes a current sourced by the 7th transistor Q7 (source current).

In the present implementation, NPN bipolar transistors are used as the 14th and 15th transistors (Q14, Q15) and the base electrodes of the 14th and 15th transistors (Q14, Q15) are connected in common. As to the 15th transistor Q15, its collector electrode is connected to the collector electrode of the transistor Q3; its emitter electrode is connected to the sink power line, and its collector and base electrodes are short-circuited to form a diode. As to the 14th transistor Q14, its collector electrode is connected in common with the emitter electrode of the transistor Q7 and the source electrode of the first conductivity type transistor M1, and its emitter electrode is connected to the sink power line.

A sixth current mirror section 170 is an implementation of a "second source side current mirror section" according to the invention. The sixth current mirror section 170 comprises a fifth transistor Q5 (one second source side transistor) connected in series to the source power line side of the 13th transistor Q13 and connected to form a diode, and a fourth transistor Q4 (the other second source side transistor) whose control electrode (e.g., a base electrode described later) is connected to the control electrode (e.g., a base electrode) of the fifth transistor Q5. The sink power line side of the 4th transistor Q4 is connected in common with the connection point of the second conductivity type transistor M2 and the 9th transistor Q9. With this configuration, the collector current of the 13th transistor Q13, copied from the variable current I1, flows through the 5th transistor Q5; the current through the 5th transistor Q5 is copied into the. 4th transistor Q4, and the collector current through the 4th transistor Q4 becomes a current sunk by the 9th transistor Q9 (sink current).

In the implementation, PNP bipolar transistors are used as the 4th and 5th transistors (Q4, Q5) and the base electrodes of the 4th and 5th transistors (Q4, Q5) are connected in common. As to the 5th transistor Q5, its collector electrode is connected to the collector electrode of the transistor Q13; its emitter electrode is connected to the source power line, and its collector and base electrodes are short-circuited to form a diode. As to the 4th transistor Q4, its collector electrode is connected in common with the emitter electrode of the transistor Q9 and the source electrode of the second conductivity type transistor M2, and its emitter electrode is connected to the source power line.

As to the first amplitude adjusting circuit 100 having the above configuration, a description will be made focusing on the second, fourth, and sixth current mirror sections 120, 140, 170 and the inverter 150.

The variable current I1 of the variable current source 105 is copied as the emitter currents of the 11th to 13th transistors (Q11, Q12, Q13) of the second current mirror section 120. Then, the emitter current of the 12th transistor Q12, copied from the variable current I1, flows through the 8th transistor Q8 of the fourth current mirror section 140. Here, the current through the 8th transistor Q8 is set almost equal to the variable current I1 of the variable current source 105.

Meanwhile, the emitter current of the 13th transistor Q13, copied from the variable current I1, flows through the 5th transistor Q5 of the sixth current mirror section 170. Here, the current through the 5th transistor Q5 is set almost equal to the variable current I1 of the variable current source 105. Furthermore, in the sixth current mirror section 170, the collector current of the 5th transistor Q5 is copied as the collector current of the 4th transistor Q4, which becomes a current sunk by the 9th transistor Q9. This sunk current is set almost equal to the variable current I1 of the variable current source 105.

As seen from the above description, in the fourth current mirror section 140, the emitter current of the 8th transistor Q8 and the emitter current (sink current) of the 9th transistor Q9 are set almost equal. As a result, the VBEs (base-to-emitter voltages) of the 8th transistor Q8 and the 9th transistor Q9 are also set almost equal. That is, by a simple mechanism adjusting the variable current I1 of the variable current source 105, the emitter current and VBE of the 9th transistor Q9 is adjustable arbitrarily, and therefore the source voltage of the second conductivity type transistor M2 of the inverter 150 and thus the bottom side amplitude level of its output signal VOUT1 are also adjustable arbitrarily.

Moreover, since the emitter currents and VBEs of the 8th transistor Q8 and the 9th transistor Q9 are set almost equal, variation in the emitter current and VBE of the 9th transistor Q9 due to the difference in temperature characteristic between the transistors Q8 and Q9 is suppressed. The VBE of the 8th transistor Q8 is decided by a reference voltage applied to the reference voltage applying point 180 and the voltage across the second resistor R2. Thus, the source voltage of the second conductivity type transistor M2 of the inverter 150 is stabilized against temperature variation, thus stabilizing the bottom side amplitude level of the output signal VOUT1 of the inverter 150 against temperature variation.

As to the first amplitude adjusting circuit 100 having the above configuration, a description will be made focusing on the first, third, and fifth current mirror sections 110, 130, 160 and the inverter 150.

The variable current I1 of the variable current source 105 is copied as the emitter currents of the 1st to 3rd transistors (Q1, Q2, Q3) of the first current mirror section 110. Then, the collector current of the 2nd transistor Q2, copied from the variable current I1, flows through the 6th transistor Q6 of the 3rd current mirror section 130. Here, the current through the 6th transistor Q6 is set almost equal to the variable current I1 of the variable current source 105.

Meanwhile, the collector current of the 3rd transistor Q3, copied from the variable current I1, flows through the 15th transistor Q15 of the 5th current mirror section 160. Here, the current through the 15th transistor Q15 is set almost equal to the variable current I1 of the variable current source 105. Furthermore, in the 5th current mirror section 160, the emitter current of the 15th transistor Q15 is copied as the emitter current of the 14th transistor Q14, which becomes a current sourced by the 7th transistor Q7. This sourced current is set almost equal to the variable current I1 of the variable current source 105.

As seen from the above description, in the 3rd current mirror section 130, the emitter currents of the 6th transistor Q6 and the 7th transistor Q7 are set almost equal. As a result, the VBEs (base-to-emitter voltages) of the 6th transistor Q6 and the 7th transistor Q7 are also set almost equal. That is, by a simple mechanism adjusting the variable current I1 of the variable current source 105, the emitter current and VBE of the 7th transistor Q7 is adjustable arbitrarily, and therefore the source voltage of the first conductivity type transistor M1 of the inverter 150 and thus the peak side amplitude level of its output signal VOUT1 are also adjustable arbitrarily.

Moreover, since the emitter currents and VBEs of the 6th transistor Q6 and the 7th transistor Q7 are set almost equal, variation in the emitter current and VBE of the 7th transistor Q7 due to the difference in temperature characteristic between the transistors Q6 and Q7 is suppressed. The VBE of the 6th transistor Q6 is decided by the reference voltage applied to the reference voltage applying point 180 and the voltage across the first resistor R1. Thus, the source voltage of the first conductivity type transistor M1 of the inverter 150 is stabilized against temperature variation, thus stabilizing the peak side amplitude level of the output signal VOUT1 of the inverter 150 against temperature variation.

==Capacitors==

In the first amplitude adjusting circuit 100 of FIG. 1, the common connection point of the 4th transistor Q4, the second conductivity type transistor M2, and the 9th transistor Q9 is connected to the other electrode of a first capacitor C1 whose one electrode is connected to the sink power line. And the common connection point of the 14th transistor Q14, the 7th transistor Q7, and the first conductivity type transistor M1 is connected to the other electrode of a second capacitor C2 whose one electrode is connected to the sink power line.

Figure 2:
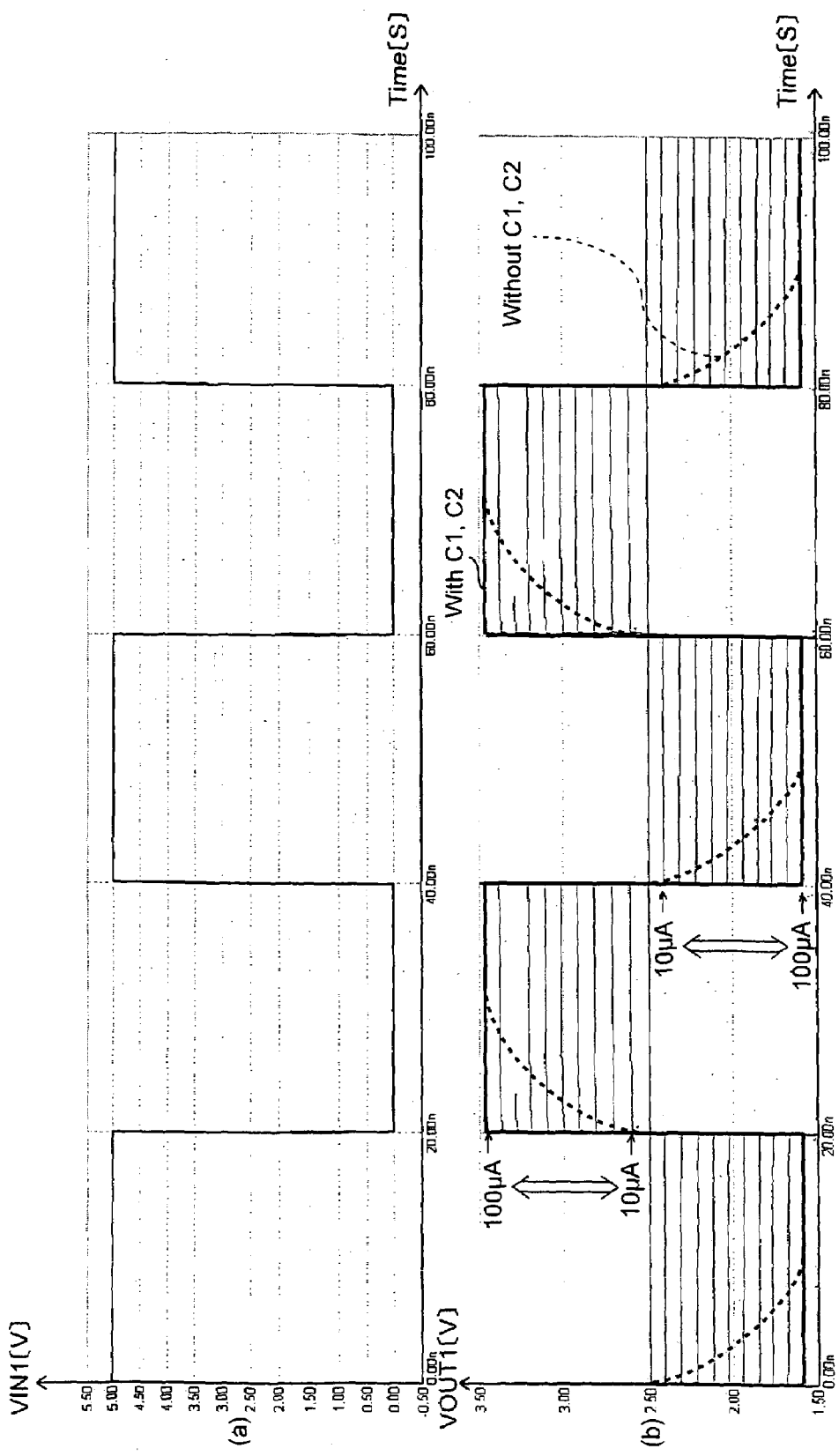
FIG. 2 is a diagram showing the waveforms of an input signal VIN1 and an output signal VOUT1 in response thereto for the first amplitude adjusting circuit according to the first implementation of the present invention.

The effect of these capacitors C1, C2 will be described using FIG. 2.

FIG. 2(a) shows the waveform of the input signal VIN1 of a rectangular waveform having an amplitude level of 2.50 V for both peak and bottom sides with 2.50 V as its reference. FIG. 2(b) shows the waveform of the output signal VOUT1 of the inverter 150 in response to the input signal VIN1 of FIG. 2(a). Note that the output signal VOUT1 of FIG. 2(b) shows the waveform for where the variable current I1 of the variable current source 105 is increased by steps of 10 μA from 10 to 100 μA. For example, when the variable current I1 is at 100 μA, the output signal VOUT1 has a waveform whose amplitude level is 1.00 V for both peak and bottom sides with 2.50 V as the reference. The waveform denoted by shot dash lines in FIG. 2(b) is the waveform of the output signal VOUT1 that would occur without the capacitors C1, C2.

Here, from the waveform of the output signal VOUT1 shown in FIG. 2(b), it is seen that for any variable current I1, the amplitude levels for the peak and bottom sides are symmetrical vertically. As shown in FIG. 2(b), it is seen that without the capacitors C1, C2, going slow occurs in the waveform of the output signal VOUT1 in response to changes in the logic level of the input signal VIN1. For example, when the input signal VIN1 switches from the H level to the L level, the first conductivity type transistor M1 switches from a non-conductive state to a conductive state. At this switching, the current through the first conductivity type transistor M1 flows into the rear-stage amplifier 50, thereby causing the waveform of the output signal VOUT1 to go slow.

In this case, while the first conductivity type transistor M1 is non-conductive, the capacitor C2 is charged. Hence, the charged voltage of the capacitor C2 solves the output signal VOUT1 going slow. Also, when the second conductivity type transistor M2 switches from a non-conductive state to a conductive state, the charged voltage of the capacitor C1 does likewise. As such, the capability of the output signal VOUT1 to follow the input signal VIN1 is improved.

==Reference Voltage==

In the first amplitude adjusting circuit 100 of FIG. 1, the reference voltage applied to a reference voltage applying point 180 that is the connection point of the first and second resistors (R1, R2) is set equal to the operation voltage of the rear-stage amplifier 50, which is at the rear stage of the inverter 150 and supplied with the output signal VOUT1. Amplifiers like the rear-stage amplifier 50 usually need to be supplied with a predetermined bias voltage. Accordingly, the output signal VCUT1 of the inverter 150 would otherwise need to have its direct-current component shifted to the bias voltage and then be supplied to the rear-stage amplifier 50. However, since the reference voltage applied to the reference voltage applying point 180 is set equal to the reference operation voltage of the rear-stage amplifier 50, the direct-current component need not be shifted. As a result, the rear-stage amplifier 50 can be directly connected to the inverter 150 without the capacitive coupling.

Furthermore, in the first amplitude adjusting circuit 100 of FIG. 1, the reference voltage applied to a reference voltage applying point 180 is set to half of the power supply potential Vcc of the source power line. As a result, it is easy to prevent either of the amplitude levels for the peak and bottom sides of the output signal VOUT1 of the inverter 150 from being saturated thus disabling amplitude adjustment, and the first amplitude adjusting circuit 100 is suitable to adjust in balance the amplitude levels for the peak and bottom sides of the output signal VOUT1.

==Bipolar Transistors==

In the first amplitude adjusting circuit 100 of FIG. 1, bipolar transistors are used as the 1st to 15th transistors (Q1 to Q15). The consumption current of the entire first amplitude adjusting circuit 100 can be reduced compared with the case where MOS transistors are used as the 1st to 15th transistors (Q1 to Q15). Moreover, because the operation voltage range is broad compared with the case of using low-voltage driven MOS transistors, the amplitude levels of the output signal VOUT1 of the inverter 150 can be adjusted over a broader range.

<Second Implementation>

Figure 3:
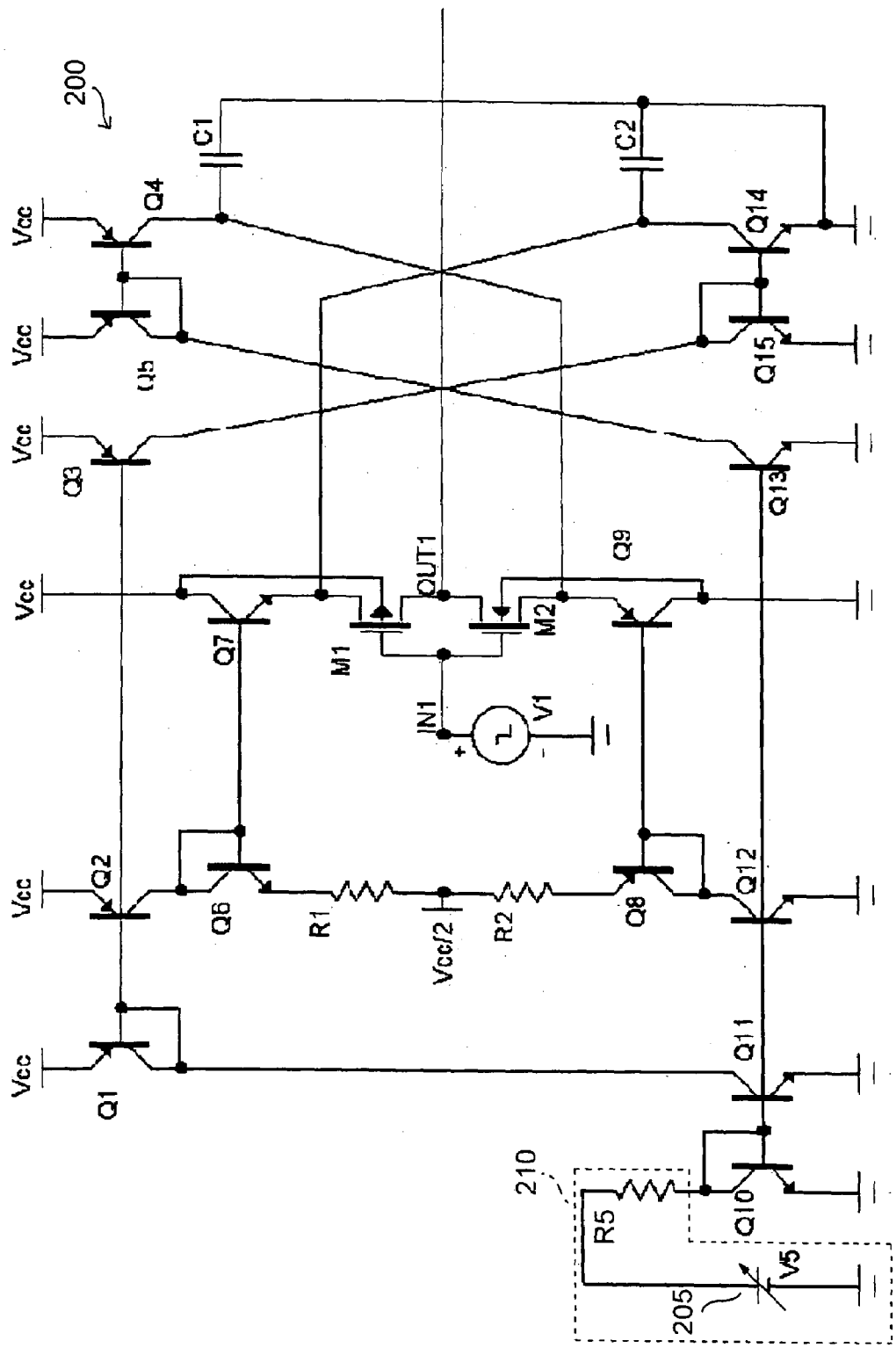
FIG. 3 is a diagram showing the configuration of a second amplitude adjusting circuit according to a second implementation of the present invention.

FIG. 3 is a diagram illustrating the configuration of a second amplitude adjusting circuit 200 according to a second implementation of the present invention, which differs from the first amplitude adjusting circuit 100 of FIG. 1 in using instead of the variable current source 105 a voltage/current converter 210 that comprises a variable voltage source 205 generating a variable voltage V5 of a sine waveform and a current generation resistor R5 having the variable voltage V5 applied thereto to produce the variable current I1.

Figure 4:
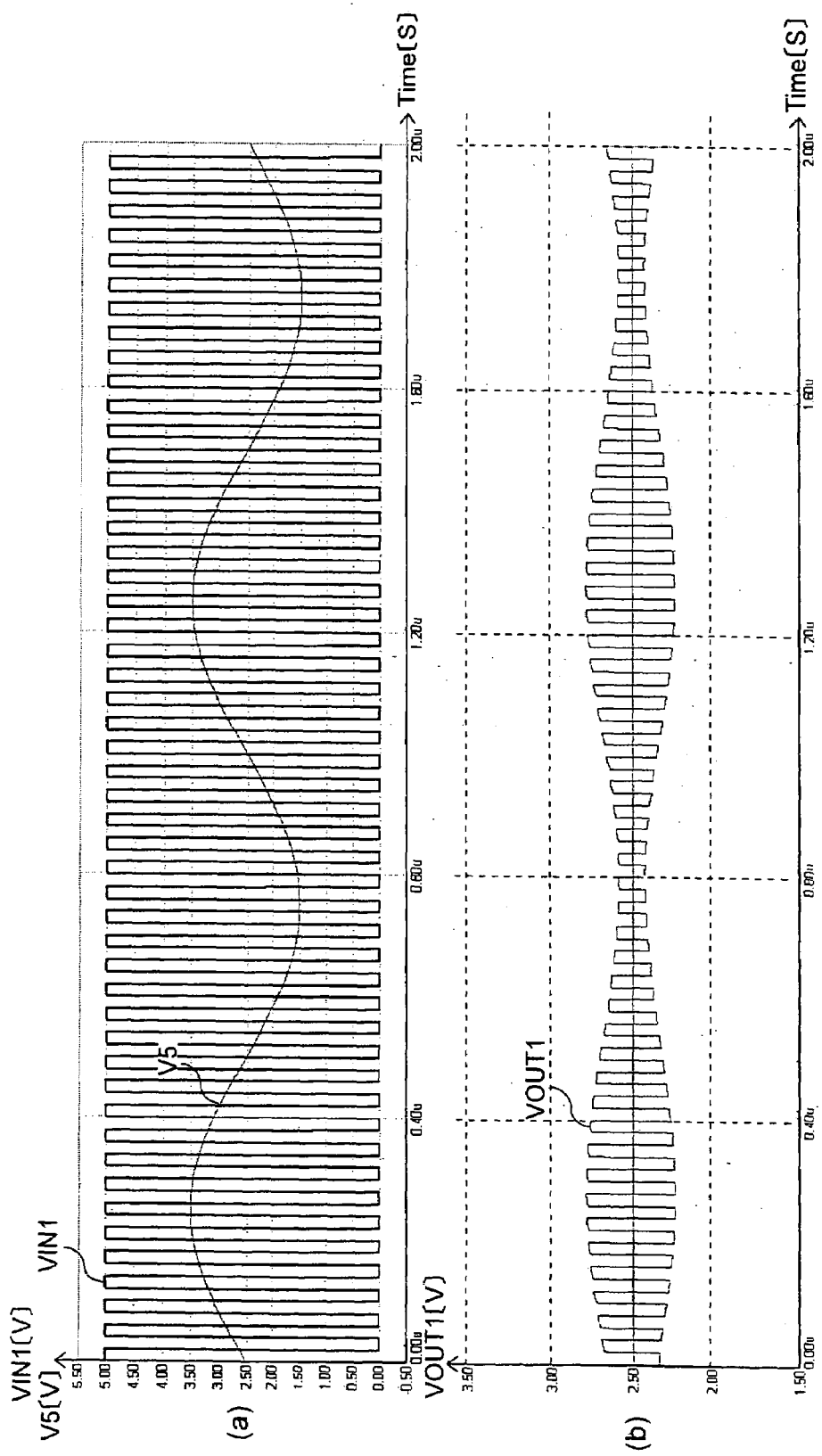
FIG. 4 is a diagram showing the waveforms of an input signal VIN1, a variable voltage V5, and an output signal VOUT1 in response thereto for the second amplitude adjusting circuit according to the second implementation of the present invention.

FIG. 4(a) shows the waveforms of the input signal VIN1 of a rectangular waveform having an amplitude level of 2.50 V for both peak and bottom sides with 2.50 V as the reference and of the variable voltage V5 of having a maximum amplitude level of 1.0 V for both peak and bottom sides with 2.50 V as the reference. FIG. 4(b) shows the waveform of the output signal VOUT1 of the inverter 150 in response to the input signal VIN1 and variable voltage V5 of FIG. 4(a). As shown in FIG. 4(b), since the variable voltage V5 is used, the output signal VOUT1 having its amplitude levels modulated into multiple levels can be easily produced in a simple manner.

<Third Implementation>

==Outline of Canceling Temperature Characteristics of Resistors==

In the first amplitude adjusting circuit 100 of FIG. 1 and the second amplitude adjusting circuit 200 of FIG. 3, the first and second resistors (R1, R2) connected in series is provided between the 6th transistor, Q6 and the 8th transistor Q8, and the reference voltage applying point 180 is provided at the connection point of the first and second resistors (R1, R2).

Needless to say, the first and second resistors (R1, R2) have a temperature characteristic. Variations in voltages across the first and second resistors (R1, R2) due to the temperature characteristic cause VBE variations of the transistors Q6 and Q8 and thus variations in the output signal VOUT1 of the inverter 150.

Accordingly, a measure to reduce the effect of the temperature characteristic of the first and second resistors (R1, R2) will be described below.

The resistance of a resistor is expressed, if a usual temperature characteristic is included, by the equation (1):

$$RT = R0 \times (1 + C1 \times T + C2 \times T^2), \quad (1)$$

where RT is the resistance ($\Omega$) at T(K), R0 is a resistance ($\Omega$) at 300K (27° C.), T is "ambient temperature (K)–300K", and C1, C2 are temperature coefficients.

Figure 6:
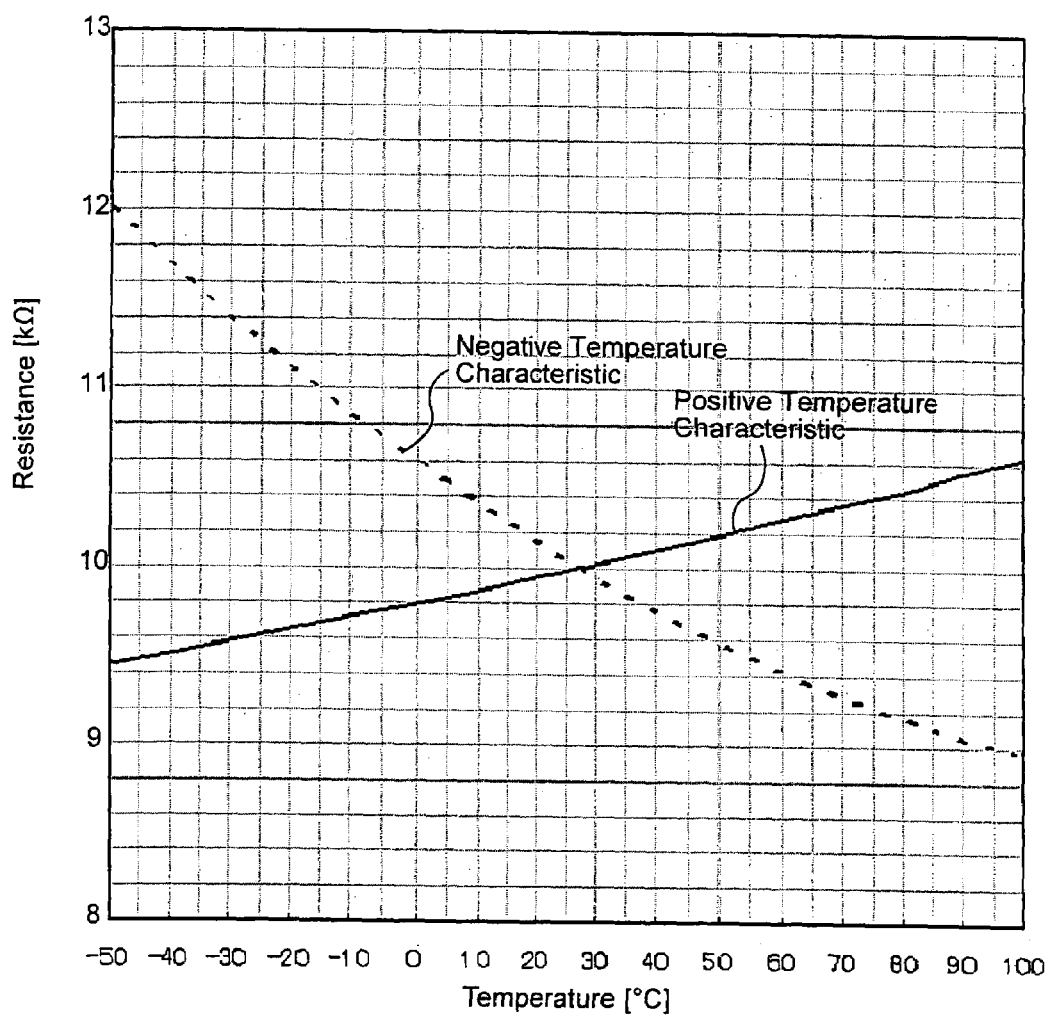
FIG. 6 shows exemplary temperature characteristics of a resistor having a positive temperature characteristic and a resistor having a negative temperature characteristic.

Here, the electrical conduction mechanism varies depending on the material forming the resistor. There are two types of resistors: a type having a positive temperature characteristic like metal and the other type having a negative temperature characteristic like semiconductor. For example, where R1 is 10 k$\Omega$, the temperature characteristic of resistance RT is shown in FIG. 6 for a resistor having a positive temperature characteristic where temperature coefficients C1, C2 are 0.8 m and 1 $\mu$ respectively and for a resistor having a negative temperature characteristic where temperature coefficients C1, C2 are –2 m and 8 $\mu$ respectively.

A mechanism for canceling the temperature characteristics of resistors where a resistor having the positive temperature characteristic and a resistor having the negative temperature characteristic are connected in series or in parallel will be described below.

==Case of Series Connection==

The case of two resistors connected in series (hereinafter called simply the case of series connection) will be described. Let suffix a indicate the positive temperature characteristic and suffix b indicate the negative temperature characteristic, then for the two resistors, R0 is rewritten as Ra and Rb, and temperature coefficient C1 as C1$a$ and C1$b$ in the equation (1) having the second order term neglected. And let R be the combined resistance.

The combined resistance R is expressed by the equation (2):

$$R = RTa + RTb$$
$$= Ra \times (1 + C1a \times T) + Rb \times (1 + C1b \times T)$$
$$= Ra + Ra \times C1a \times T + Rb + Rb \times C1b \times T$$
$$= Ra + Rb + T \times (Ra \times C1a + Rb \times C1b). \quad (2)$$

Here, if the term of temperature is zero, temperature variation of the combined resistance R is null. To this end, the equation (3) needs to be satisfied.

$$Ra \times C1a + Rb \times C1b = 0, \text{ thus}$$
$$Ra/Rb = -C1b/C1a. \quad (3)$$

That is, it is needed that the temperature coefficients are opposite to each other and the ratio of the resistances is equal to the inverse ratio of the temperature coefficients. Here, a numerical example will be shown for the case of series connection where C1$a$=0.8, C1$b$=–2, and the combined resistance R=10 k$\Omega$. The ratio of the temperature coefficients is given as the equation (4):

$$C1a:C1b = 0.8:2$$
$$= 0.4:1$$
$$= 0.714286:0.285714. \quad (4)$$

Thus, the two resistors' Ra and Rb, connected in series, are obtained as the equations (5a), (5b):

$$Ra = 10(k\Omega) \times 0.714286$$
$$= 7.142857(k\Omega), \quad (5a)$$

$$Rb = 10(k\Omega) \times 0.285714$$
$$= 2.857143(k\Omega) \quad (5b)$$

==Case of Parallel Connection==

The case of two resistors connected in parallel (hereinafter called simply the case of parallel connection) will be described. For the two resistors, the coefficients of the equation (2) are expressed in terms of conductance by the equations (6a) to (6g):

$$1/R = G, \quad (6a)$$
$$1/RTa = GTa, \quad (6b)$$
$$1/RTb = GTb, \quad (6c)$$
$$1/R0 = G0, \quad (6d)$$
$$1/C1a = D1a, \quad (6e)$$
$$1/C1b = D1b, \quad (6f)$$
$$1/T = T'. \quad (6g)$$

In this case, the combined conductance G is expressed by the equation (7):

$$G = GTa + GTb$$
$$= Ga \times (1 + D1a \times T') + Gb \times (1 + D1b \times T')$$
$$= Ga + Ga \times D1a \times T' + Gb + Gb \times D1b \times T'$$
$$= Ga + Gb + T' \times (Ga \times D1a + Gb \times D1b). \quad (7)$$

Here, if the term of temperature is zero, temperature variation of the combined conductance G is null. To this end, the equation (8) needs to be satisfied.

$$Ga \times D1a + Gb \times D1b = 0, \text{ thus}$$
$$Ga/Gb = -D1b/D1a. \quad (8)$$

That is, it is needed that the temperature coefficients are opposite to each other and the ratio of the conductance is equal to the inverse ratio of the temperature coefficients. In other words, it is needed that the temperature coefficients are opposite to each other and the ratio of the resistances is equal to the ratio of the temperature coefficients. Here, a numerical example will be shown for the case of parallel connection where the parameters have the same values as in the case of series connection. The two resistors, Ga and Gb, connected in parallel, are obtained as the equations (9a), (9b):

$$Ga = 100(mS) \times 0.714286$$
$$= 71.42857(mS), \quad (9a)$$

$$Gb = 100(mS) \times 0.285714$$
$$= 28.57143(mS). \quad (9b)$$

==Effect of the Second-Order Term==

Figure 7:
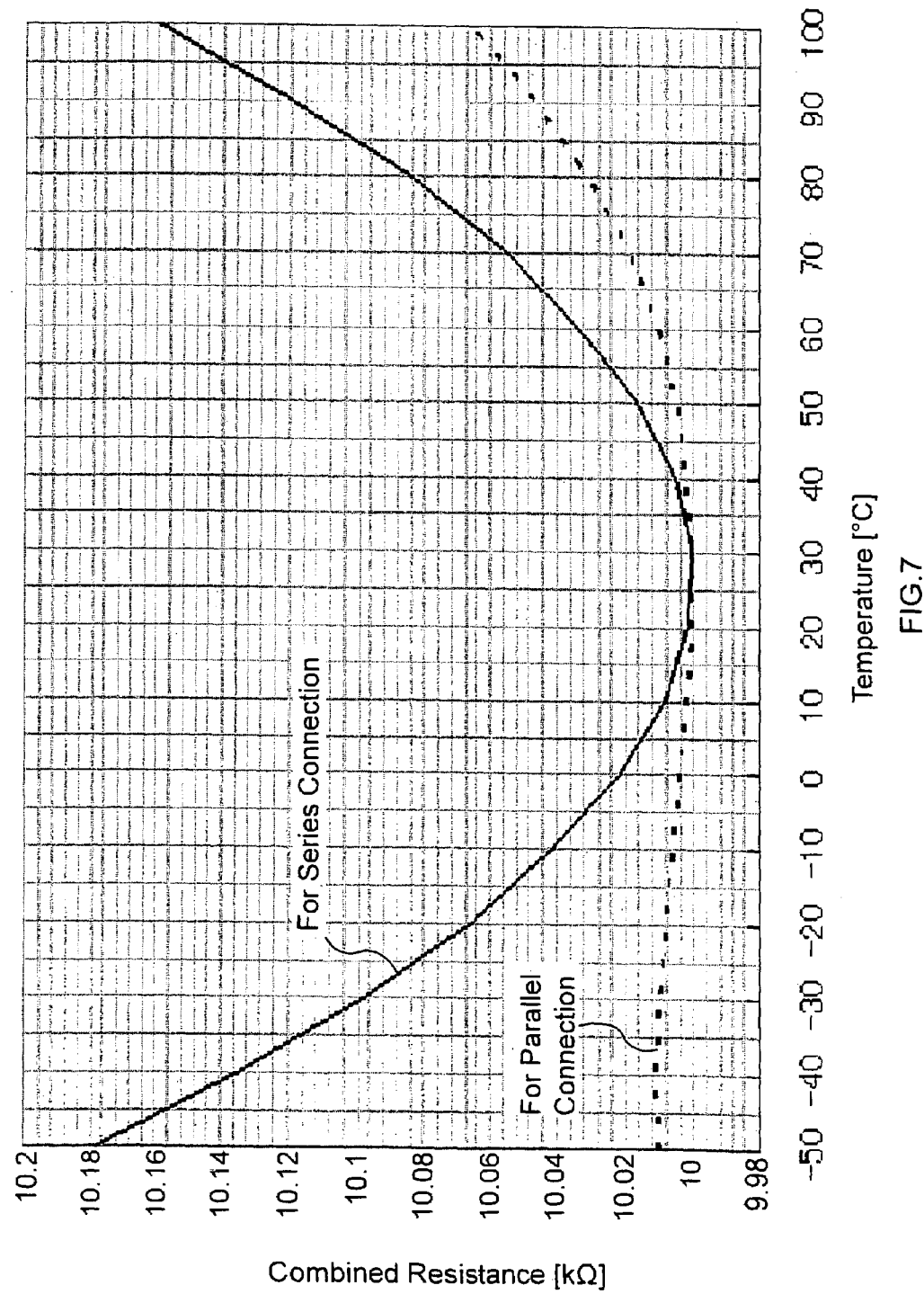
FIG. 7 shows exemplary temperature characteristics of a series connection and a parallel connection of resistors having a positive temperature characteristic and a negative temperature characteristic.

In the case of series connection and the case of parallel connection described above, the second-order term of the temperature characteristics of resistors is neglected. Here, the effect of the second-order term of the temperature characteristics of resistors on the combined resistance will be described in detail. FIG. 7 shows the temperature characteristics of a series connection and a parallel connection of resistors respectively, where the parameters have the same values as above and the second-order term of the temperature characteristics is used. From FIG. 7, it is seen that for the parallel connection, temperature variation is smaller than for the series connection. This is because the second-order term is larger for the resistance RTb of the resistor having the negative temperature characteristic than for the resistance RTa of the resistor having the positive temperature characteristic.

Here, for the series connection and the parallel connection, the contribution rate of the second-order term of the temperature characteristics of resistors will be described using the ratio of the second-order temperature coefficients C2a, C2b of the positive and negative temperature characteristics. With the above parameter values, for the series connection, the ratio of the second-order temperature coefficients C2a, C2b is obtained as the equation (10), and for the parallel connection, as the equation (11):

for the series connection $$C2a:C2b = 1\ \mu \times 0.285714 : 8\ \mu \times 0.714286$$

$$= 0.285714\ \mu : 0.714286\ \mu$$

$$= 1:20, \quad (10)$$

for the parallel connection $$C2a:C2b = 1\ \mu \times 0.714286 : 8\ \mu \times 0.285714$$

$$= 0.714286\ \mu : 2.285714\ \mu$$

$$= 1:3.2. \quad (11)$$

Thus, the contribution rate of the second-order term of the temperature characteristics of resistors is lower for the parallel connection than for the series connection. The possibility that the resistances Ra and Rb of the two resistors having the positive and negative temperature characteristics may be selected appropriately is higher for the parallel connection than for the series connection. Note that for the parallel connection the resistance is lower than for the series connection, and thus if a high resistance is required, the series connection is more suitable.

==Configuration of Third Amplitude Adjusting Circuit==

Figure 5:
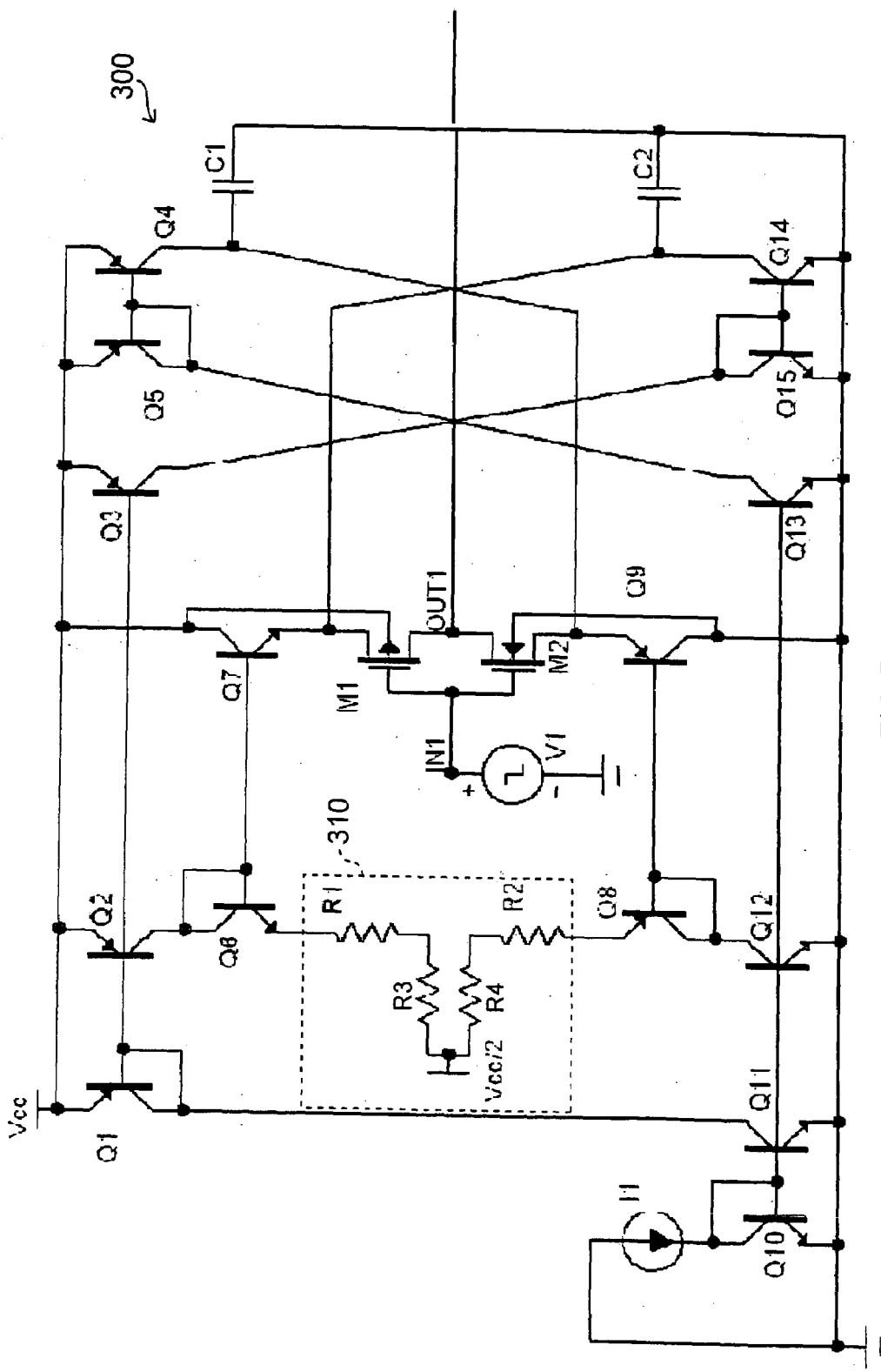
FIG. 5 is a diagram showing the configuration of a third amplitude adjusting circuit according to a third implementation of the present invention.

FIG. 5 is a diagram illustrating the configuration of a third amplitude adjusting circuit 300 according to a third implementation of the present invention, which differs from the first amplitude adjusting circuit 100 in that a temperature characteristic correcting section 310 is provided.

The temperature characteristic correcting section 310 uses the series connection. That is, a third resistor R3 is provided in between the first resistor R1 and the reference voltage applying point, 180, and a fourth resistor R4 is provided in between the second resistor R2 and the reference voltage applying point 180. In this implementation, the first resistor R1 has the negative temperature characteristic and the third resistor R3 has the positive temperature characteristic, but the opposite is possible. Also, the second resistor R2 has the negative temperature characteristic and the fourth resistor R4 has the positive temperature characteristic, but the opposite is possible.

On the basis of the equation (3), the first-order temperature coefficients of the first and third resistors (R1, R3) are set opposite to each other and the ratio of the resistances is set equal to the inverse ratio of the first-order temperature coefficients. Further, the first-order temperature coefficients of the second and fourth resistors (R2, R4) are set opposite to each other and the ratio of the resistances is set equal to the inverse ratio of the first-order temperature coefficients. As a result, variation in the output amplitude level due to the temperature characteristics of the first and second resistors (R1, R2) can be corrected.

The temperature characteristic correcting section 310 may use the parallel connection. That is, the first and third resistors (R1, R3) are connected in parallel and the second and fourth resistors (R2, R4) are connected in parallel. In this case, on the basis of the equation (8), the first-order temperature coefficients of the first and third resistors (R1, R3) are set opposite to each other and the ratio of the resistances is set equal to the ratio of the first-order temperature coefficients. Further, the first-order temperature coefficients of the second and fourth resistors (R2, R4) are set opposite to each other and the ratio of the resistances is set equal to the ratio of the first-order temperature coefficients. As a result, variation in the output amplitude level due to the temperature characteristics of the first and second resistors (R1, R2) can be corrected.

Likewise, the same measure to cancel temperature characteristics, i.e., the use of either the series connection or the parallel connection can be applied to the current generation resistor R5 of the second amplitude adjusting circuit 200. As a result, the temperature characteristic of the current generation resistor R5 is cancelled, thus stabilizing the amplitude level of the output signal VOUT1 of the inverter 150.

Although the implementations of the present invention have been described, the above implementations are provided to facilitate the understanding of the present invention and not intended to limit the present invention. It should be understood that various changes and alterations can be made therein without departing from spirit and scope of the invention and that the present invention includes its equivalents.

What is claimed is:

1. An amplitude adjusting circuit which adjusts an amplitude level of its output signal in response to an input signal, comprising:

a variable current source (I1) that generates a variable current;

an inverter that has a first conductivity type transistor (M1) and a second conductivity type transistor (M2) which are opposite in conductivity type to each other and connected in series in between a source power line and a sink power line, and produces the output signal whose logic level is the inverse of that of the input signal;

a first source-side current mirror section provided on the source power line side, where of two first source-side transistors whose control electrodes are connected in common, one first source-side transistor (Q6) is connected to form a diode, the other first source-side transistor (Q7) is provided between the source power line and the first conductivity type transistor (M1), and a current corresponding to the variable current flows through the one first source-side transistor (Q6);

a first sink-side current mirror section provided on the sink power line side, where of two first sink-side transistors whose control electrodes are connected in common, one first sink-side transistor (Q8) is connected to form a diode, the other first sink-side transistor (Q9) is provided between the second conductivity type transistor (M2) and the sink power line, and a current corresponding to the variable current flows through the one first sink-side transistor (Q8);

a second sink-side current mirror section provided on the sink power line side, where of two second sink-side transistors whose control electrodes are connected in common, one second sink-side transistor (Q15) is connected to form a diode, the other second sink-side transistor (Q14) is provided between the sink power line and a connection point of the other first source-side transistor (Q7) and the first conductivity type transistor (M1), and currents corresponding to the variable current flow through the one and other second sink-side transistors (Q15, Q14), the current through the transistor (Q14) flowing through the other first source-side transistor (Q7); and a second source-side current mirror section provided on the source power line side, where of two second source-side transistors whose control electrodes are connected in common, one second source-side transistor (Q5) is connected to form a diode, the other second source-side transistor (Q4) is provided between the source power line and a connection point of the second conductivity type transistor (M2) and the other first sink-side transistor (Q9), and currents corresponding to the variable current flow through the one and other second source-side transistor (Q5, Q4), the current through the transistor (Q4) flowing through the other first sink-side transistor (Q9), wherein with the amplitude level of the output signal being adjusted according to the variable current, the respective currents flowing through the one and, other first source-side transistors (Q6, Q7) are set equal, and the respective currents flowing through the one and other first sink-side transistors (Q8, Q9) are set equal.

2. The amplitude adjusting circuit according to claim 1, wherein a common connection point of the, second conductivity type transistor (M2), the other first sink-side transistor (Q9), and the other second source-side transistor (Q4) is connected to the other electrode of a first capacitor (C1) whose one electrode is connected to the sink power line, and wherein a common connection point of the first conductivity type transistor (M1), the other first source-side transistor (Q7), and the other second sink-side transistor (Q14) is connected to the other electrode of a second capacitor (C2) whose one electrode is connected to the sink power line.

3. The amplitude adjusting circuit according to claim 1, wherein a first resistor (R1) and a second resistor (R2) are connected in series between the one first source-side transistor (Q6) and the one first sink-side transistor (Q8), and a reference voltage of the same level as that of an operation voltage of an amplifier at the rear stage of the inverter is applied to a connection point of the first and second resistors.

4. The amplitude adjusting circuit according to claim 3, wherein the reference voltage is half of power supply potential on the source power line.

5. The amplitude adjusting circuit according to claim 1, wherein the first and second source-side transistors and the first and second sink-side transistors are bipolar transistors.

6. The amplitude adjusting circuit according to claim 1, wherein the variable current source is replaced with a variable voltage source (V5) generating a variable voltage of a sine waveform and a current generation resistor (R5) having the variable voltage applied thereto to generate the variable current.

7. The amplitude adjusting circuit according to claim 3, wherein a third resistor (R3) is provided between the first resistor (R1) and a connection point of, the first and second resistors (R1, R2), to which the reference voltage is applied, and a fourth resistor (R4) is provided between the second resistor (R2) and the connection point of the first and second resistors (R1, R2), to which the reference voltage is applied, and wherein temperature coefficients of the first and third resistors (R1, R3) are set opposite to each other and a ratio of their resistances is set equal to an inverse ratio of their temperature coefficients, and temperature coefficients of the second and fourth resistors (R2, R4) are set opposite to each other and a ratio of their resistances is set equal to an inverse ratio of their temperature coefficients.

8. The amplitude adjusting circuit according to claim 6, further comprising:

a resistor connected in series with the current generation resistor (R5), wherein temperature coefficients of the current generation resistor (R5) and the resistor connected in series therewith are set opposite to each other and a ratio of their resistances is set equal to an inverse ratio of their temperature coefficients.

9. The amplitude adjusting circuit according to claim 6, wherein a third resistor (R3) is provided to be connected in parallel to the first resistor (R1), and a fourth resistor (R4) is provided to be connected in parallel to the second resistor (R2), and wherein temperature coefficients of the first and third resistors (R1, R3) are set opposite to each other and a ratio of their resistances is set equal to a ratio of their temperature coefficients, and temperature coefficients of the second and fourth resistors (R2, R4) are set opposite to each other and a ratio of their resistances is set equal to a ratio of their temperature coefficients.

10. The amplitude adjusting circuit according to claim 6, further comprising:

a resistor connected in parallel to the current generation resistor (R5), wherein temperature coefficients of the current generation resistor (R5) and the resistor connected in parallel thereto are set opposite to each other and a ratio of their resistances is set equal to a ratio of their temperature coefficients.

11. An amplitude adjusting circuit which adjusts an amplitude level of its output signal in response to an input signal, comprising:

a variable current source (I1) that generates a variable current;

a first current mirror section in which control electrodes of first, second, and third transistors (Q1, Q2, Q3) provided on a source power line side are connected in common, the first transistor (Q1) is connected to form a diode, and the variable current flowing through a tenth transistor (Q10) connected to form a diode is copied into each of the first to third transistors (Q1, Q2, Q3);

a second current mirror section in which control electrodes of 11th, 12th, and 13th transistors (Q11, Q12, Q13) provided on a sink power line side are connected in common, and the variable current flowing through the tenth transistor (Q10) is copied into each of the 11th to 13th transistors (Q11, Q12, Q13);

a third current mirror section having a sixth transistor (Q6) connected to form a diode and connected in series to the sink power line side of the second transistor (Q2) and a seventh transistor (Q7) whose control electrode is connected to the control electrode of the sixth transistor (Q6), in which a current through the second transistor (Q2) copied from the variable current flows through the sixth transistor (Q6);

a fourth current mirror section having an eighth transistor (Q8) connected to form a diode and connected in series to the source power line side of the 12th transistor (Q12) and a ninth transistor (Q9) whose control electrode is connected to the control electrode of the eighth transistor (Q8), in which a current through the 12th transistor (Q12) copied from the variable current flows through the eighth transistor (Q8);

an inverter that has a first conductivity type transistor (M1) connected in series to the sink power line side of the seventh transistor (Q7) and a second conductivity type transistor (M2) connected in series to the source power line side of the ninth transistor (Q9), the transistors (M1), (M2) being connected in series, in which a current through the seventh transistor (Q7) flows through the first conductivity type transistor (M1) and a current through the ninth transistor (Q9) flows through the second conductivity type transistor (M2), the inverter producing the output signal that has either one logic level corresponding to a current level of the seventh transistor (Q7) when the first conductivity type transistor (M1) is rendered conductive according to the logic level of an input signal, or the other logic level corresponding to a current level of the ninth transistor (Q9) when the second conductivity type transistor (M2) is rendered conductive;

a fifth current mirror section having a 15th transistor (Q15) connected to form a diode and connected in series to the sink power line side of the third transistor (Q3) and a 14th transistor (Q14) whose control electrode is connected to the control electrode of the 15th transistor (Q15), where the source power line side of the 14th transistor (Q14) is connected in common with a connection point of the seventh transistor (Q7) and the first conductivity type transistor (M1), and where a current through the third transistor (Q3) copied from the variable current flows through the 15th transistor (Q15), the current through the 15th transistor (Q15) is copied into the 14th transistor (Q14), and the current through the 14th transistor (Q14) becomes a current sourced by the seventh transistor (Q7); and a sixth current mirror section having a fifth transistor (Q5) connected to form a diode and connected in series to the source power line side of the 13th transistor (Q13) and a fourth transistor (Q4) whose control electrode is connected to the control electrode of the fifth transistor (Q5), where the sink power line side of the fourth transistor (Q4) is connected in common with a connection point of the second conductivity type transistor (M2) and the ninth transistor (Q9), and where a current through the 13th transistor (Q13) copied from the variable current flows through the fifth transistor (Q5), the current through the fifth transistor (Q5) is copied into the fourth transistor (Q4), and the current through the fourth transistor (Q4) becomes a current sunk by the ninth transistor (Q9).

* * * * *